US010181354B2

(12) United States Patent
Sheng et al.

(10) Patent No.: US 10,181,354 B2
(45) Date of Patent: Jan. 15, 2019

(54) SENSE AMPLIFIER WITH BIT LINE PRE-CHARGE CIRCUIT FOR READING FLASH MEMORY CELLS IN AN ARRAY

(71) Applicant: Silicon Storage Technology, Inc., San Jose, CA (US)

(72) Inventors: Bin Sheng, Shanghai (CN); Yao Zhou, Shanghai (CN); Tao Wang, Shanghai (CN); Xiaozhou Qian, Shanghai (CN); Lu Guo, Shanghai (CN); Ning Bai, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/690,159

(22) Filed: Aug. 29, 2017

(65) Prior Publication Data

US 2018/0075914 A1    Mar. 15, 2018

(51) Int. Cl.
G11C 16/08    (2006.01)
G11C 16/28    (2006.01)
G11C 16/04    (2006.01)

(52) U.S. Cl.
CPC .......... *G11C 16/28* (2013.01); *G11C 16/0425* (2013.01); *G11C 16/08* (2013.01)

(58) Field of Classification Search
CPC ...... G11C 16/28; G11C 16/0425; G11C 16/08
USPC ..................................................... 365/185.2
See application file for complete search history.

(56) References Cited

U.S. PATENT DOCUMENTS

| 5,748,538 | A  | * | 5/1998  | Lee ......................... G11C 8/08 |
|           |    |   |         |                                257/E27.103 |
| 6,665,214 | B1 | * | 12/2003 | Cheah ..................... G11C 29/02 |
|           |    |   |         |                                365/185.19 |
| 6,714,458 | B2 | * | 3/2004  | Gualandri .............. G11C 16/16 |
|           |    |   |         |                                365/185.25 |
| 7,050,335 | B2 | * | 5/2006  | Leconte ............ G11C 16/3418 |
|           |    |   |         |                                365/185.29 |
| 8,898,543 | B2 | * | 11/2014 | Jo ........................ G06F 11/1072 |
|           |    |   |         |                                714/721 |
| 2001/0038562 | A1 |   | 11/2001 | Rohr |
| 2003/0053348 | A1 |   | 3/2003  | Marotta |
| 2007/0165473 | A1 |   | 7/2007  | Suzuki |
| 2007/0263438 | A1 |   | 11/2007 | Chen |
| 2008/0151588 | A1 |   | 6/2008  | Agarwal |
| 2010/0008147 | A1 |   | 1/2010  | O |
| 2010/0118595 | A1 |   | 5/2010  | Bae |
| 2012/0170351 | A1 |   | 7/2012  | Clinton |
| 2013/0301362 | A1 |   | 11/2013 | Benten |
| 2014/0140138 | A1 |   | 5/2014  | Tran et al. |
| 2016/0098059 | A1 |   | 4/2016  | Sood |
| 2016/0254060 | A1 |   | 9/2016  | Pi |

FOREIGN PATENT DOCUMENTS

WO    2015 104299 A1    7/2015

\* cited by examiner

*Primary Examiner* — Harry W Byrne
(74) *Attorney, Agent, or Firm* — DLA Piper LLP (US)

(57) ABSTRACT

The present invention relates to an improved sense amplifier for reading values in flash memory cells in an array. In one embodiment, a sense amplifier comprises an improved pre-charge circuit for pre-charging a bit line during a pre-charge period to increase the speed of read operations. In another embodiment, a sense amplifier comprises simplified address decoding circuitry to increase the speed of read operations.

6 Claims, 10 Drawing Sheets

SENSE AMPLIFIER WITH BIT LINE PRE-CHARGE CIRCUIT FOR READING FLASH MEMORY CELLS IN AN ARRAY

RELATED PATENT APPLICATION

This application claims the benefit of Chinese Patent Application No. 201610815185.0 filed on Sep. 9, 2016, and which is incorporated herein by reference.

TECHNICAL FIELD

The present invention relates to an improved sense amplifier for reading values in flash memory cells in an array. In one embodiment, a sense amplifier comprises an improved pre-charge circuit for pre-charging a bit line during a pre-charge period to increase the speed of read operations. In another embodiment, a sense amplifier comprises simplified address decoding circuitry to increase the speed of read operations.

BACKGROUND OF THE INVENTION

Non-volatile memory cells are well known in the art. One prior art non-volatile split gate memory cell 10, which contains five terminals, is shown in FIG. 1. Memory cell 10 comprises semiconductor substrate 12 of a first conductivity type, such as P type. Substrate 12 has a surface on which there is formed a first region 14 (also known as the source line SL) of a second conductivity type, such as N type. A second region 16 (also known as the drain line) also of N type is formed on the surface of substrate 12. Between the first region 14 and the second region 16 is channel region 18. Bit line BL 20 is connected to the second region 16. Word line WL 22 is positioned above a first portion of the channel region 18 and is insulated therefrom. Word line 22 has little or no overlap with the second region 16. Floating gate FG 24 is over another portion of channel region 18. Floating gate 24 is insulated therefrom, and is adjacent to word line 22. Floating gate 24 is also adjacent to the first region 14. Floating gate 24 may overlap the first region 14 to provide coupling from the first region 14 into floating gate 24. Coupling gate CG (also known as control gate) 26 is over floating gate 24 and is insulated therefrom. Erase gate EG 28 is over the first region 14 and is adjacent to floating gate 24 and coupling gate 26 and is insulated therefrom. The top corner of floating gate 24 may point toward the inside corner of the T-shaped erase gate 28 to enhance erase efficiency. Erase gate 28 is also insulated from the first region 14. Memory cell 10 is more particularly described in U.S. Pat. No. 7,868,375, whose disclosure is incorporated herein by reference in its entirety.

One exemplary operation for erase and program of prior art non-volatile memory cell 10 is as follows. Memory cell 10 is erased, through a Fowler-Nordheim tunneling mechanism, by applying a high voltage on erase gate 28 with other terminals equal to zero volts. Electrons tunnel from floating gate 24 into erase gate 28 causing floating gate 24 to be positively charged, turning on the cell 10 in a read condition. The resulting cell erased state is known as '1' state.

Memory cell 10 is programmed, through a source side hot electron programming mechanism, by applying a high voltage on coupling gate 26, a high voltage on source line 14, a medium voltage on erase gate 28, and a programming current on bit line 20. A portion of electrons flowing across the gap between word line 22 and floating gate 24 acquire enough energy to inject into floating gate 24 causing the floating gate 24 to be negatively charged, turning off the cell 10 in a read condition. The resulting cell programmed state is known as '0' state.

Memory cell 10 is read in a Current Sensing Mode as following: A bias voltage is applied on bit line 20, a bias voltage is applied on word line 22, a bias voltage is applied on coupling gate 26, a bias or zero voltage is applied on erase gate 28, and a ground is applied on source line 14. There exists a cell current flowing from bit line 20 to source line 14 for an erased state and there is insignificant or zero cell current flow from the bit line 20 to the source line 14 for a programmed state. Alternatively, memory cell 10 can be read in a Reverse Current Sensing Mode, in which bit line 20 is grounded and a bias voltage is applied on source line 24. In this mode the current reverses the direction from source line 14 to bitline 20.

Memory cell 10 alternatively can be read in a Voltage Sensing Mode as following: A bias current (to ground) is applied on bit line 20, a bias voltage is applied on word line 22, a bias voltage is applied on coupling gate 26, a bias voltage is applied on erase gate 28, and a bias voltage is applied on source line 14. There exists a cell output voltage (significantly >0V) on bit line 20 for an erased state and there is insignificant or close to zero output voltage on bit line 20 for a programmed state. Alternatively, memory cell 10 can be read in a Reverse Voltage Sensing Mode, in which bit line 20 is biased at a bias voltage and a bias current (to ground) is applied on source line 14. In this mode, memory cell 10 output voltage is on the source line 14 instead of on the bit line 20.

The prior art also includes decoding circuitry for selecting an address within a memory array and selecting a bit line within the array. FIG. 5 depicts prior art memory system 500. Memory system 500 comprises array 530 and array 540, which typically are identical memory arrays of floating gate memory cells. Address lines 580 carry the address signals of the memory location to which the read or write operation applies. Address decoder 510 and address decoder 520 decode the address carried on address lines 580 and activate the appropriate word line and bit line in array 530 or array 540 so that a word of data is read from the correct location or a word of data is written to the correct location. As part of this operation, address decoder 510 controls bit line multiplexer 550, and address decoder 520 controls bit line multiplexer 560.

As an example, during a read operation of a particular address in array 530, the appropriate word line X and bit line Y will be activated in array 530, and bit line multiplexer 550 will output word 95 from that location in array 530 as an input to comparator 570. Concurrently, all word lines for array 540 are off, because the read operation does not involve array 540. The same bit line Y that was activated in array 530 is activated in array 540, and bit line multiplexer 560 outputs a word 96 from bit line Y as an input to comparator 570. Because no word line was activated for array 540, word 96 will not constitute data stored in array 540, but rather, represents a pre-charge voltage stored within bit line multiplexer 560. This voltage is used as a reference voltage by comparator 570. Comparator 570 will compare word 95 and word 96. One of ordinary skill in the art will understand that word 95 comprises one or more bits, and word 96 comprises one or more bits. Comparator 570 comprises a comparator circuit for each bit within word 95 and within word 96. That is, if word 95 and word 96 are 8 bits each, comparator 570 will comprise 8 comparator circuits, where each comparator circuit will compare one bit from word 95 with one bit at the same location within word 96. Output line 590 contains the result of the comparison of each bit pair.

If a bit within word 95 is higher than corresponding bit in word 96, then it is interpreted as a "1," and outline line 590 will contain a "1" at that location. If a bit within word 95 is equal to or lower than corresponding bit in word 96, then it is interpreted as a "0," and output line 590 will contain a "0" at that location.

One of ordinary skill in the art will appreciate that the prior art system of FIG. 5 contains two stages of multiplexors—address decoders 510 and 520 and bit line multiplexors 550 and 560. The ability to pre-charge bit lines is directly impacted by the number of stages of multiplexors involved in a read operation.

FIG. 6A shows the design of FIG. 5 in greater detail. Sense amplifier 600 comprises a first circuit coupled to selected memory cell 640 (which can be a cell in array 530) and a second circuit coupled to dummy cell 650 (which can be a cell in array 540). The first circuit comprises part of address MUX level 630 (which is a portion of address decoder 510), and the second circuit comprises part of address MUX level 630 (which is a portion of address decoder 520). The first circuit further comprises part of bit line MUX level 620 (which is a portion of bit line multiplexor 550), and the second circuit comprises part of dummy bit line MUX level 620 (which is a portion of bit line multiplexor 560). The first circuit further comprises PMOS transistors 601, 602, and 607, and second circuit further comprises PMOS transistors 608, 609, and 614.

The nodes IOR and DUMIOR are coupled to the inputs of comparator 615. The output of comparator 615 is coupled to inverter 616. The output of inverter 616 is coupled to buffer 617, which outputs the signal DOUT, which indicates the value stored in selected cell 640. In this prior art design, PMOS transistors 601 and 608 are not symmetrical.

FIG. 6B depicts certain operating characteristics of sense amplifier 600. Timing diagram 660 shows the behavior of PCHENB, DUMIOR, IOR, Pre_BL, and BL during a pre-charge operation, which typically occurs during a pre-charge period and precedes a read operation. As can be seen, the delay T1 is undesired and represents an unwanted increase in pre-charge time.

Diagram 670 shows the situation where selected cell 640 stores a "1." Once the read operation commences, IOR will be pulled toward ground, below the pre-charge value of DUMIOR. Diagram 680 shows the situation where selected cell 640 stores a "0." Once the read operation commences, IOR will be pulled toward VDD, above the pre-charge value of DUMIOR.

With flash memory systems becoming ubiquitous in all manner of computing and electronic devices, it is increasingly important to create designs that enable faster read and operations and that are able to pre-charge bit lines as fast as possible.

SUMMARY OF THE INVENTION

The present invention reduces the amount of time needed for the pre-charge operation and thereby creates a faster system for read operations. One embodiment comprises an improved pre-charge circuit for pre-charging bit lines for a selected flash memory cell and a dummy flash memory cell during a pre-charge period, which results in a faster read operation. Another embodiment eliminates one level of multiplexor used during a read operation, which also reduces the amount of time needed for a pre-charge operation, which also results in a faster read operation.

DETAILED DESCRIPTION OF THE PREFERRED EMBODIMENT

Figure 1:
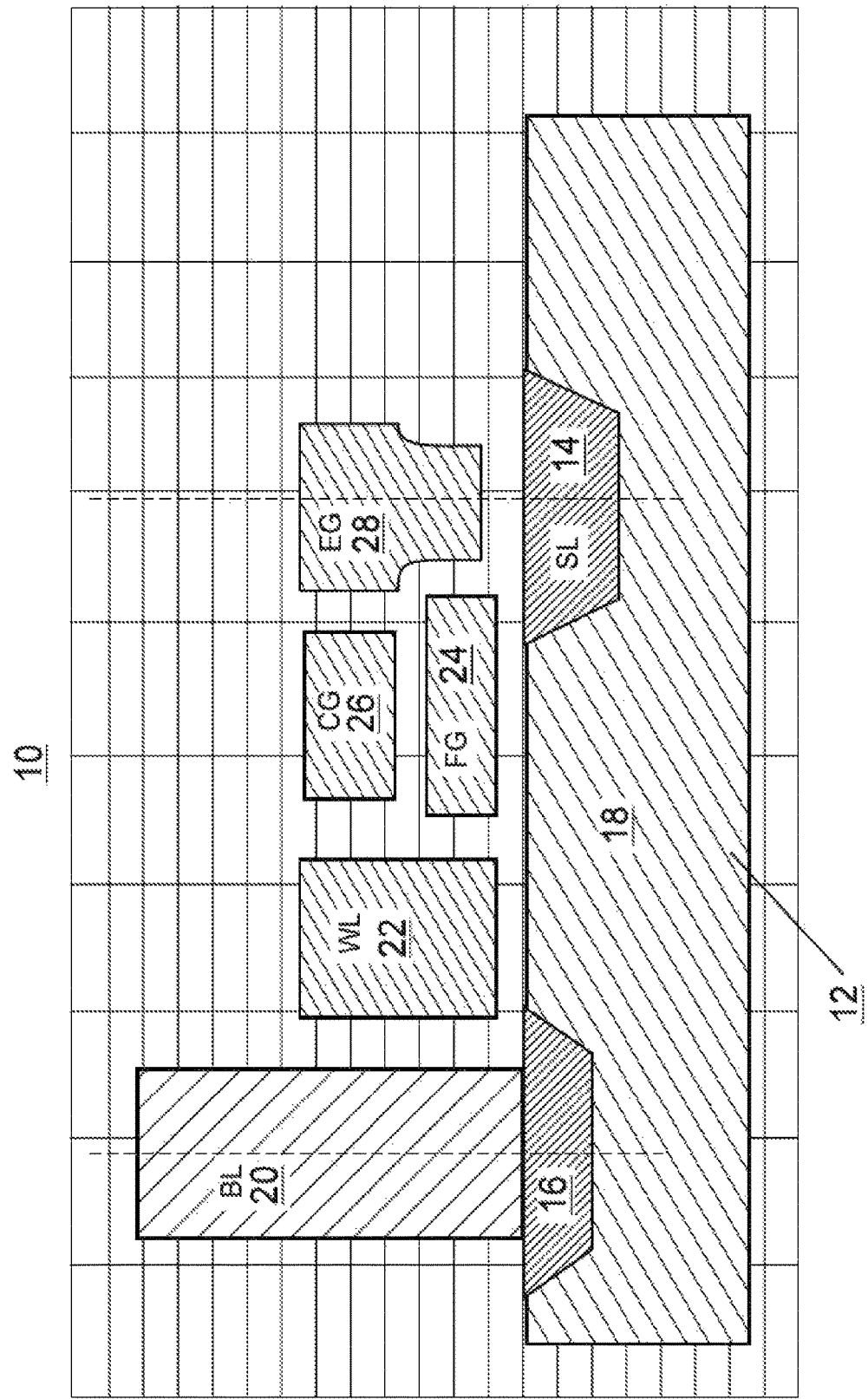
FIG. 1 is a cross-sectional view of a non-volatile memory cell of the prior art to which the method of the present invention can be applied.
Figure 2:
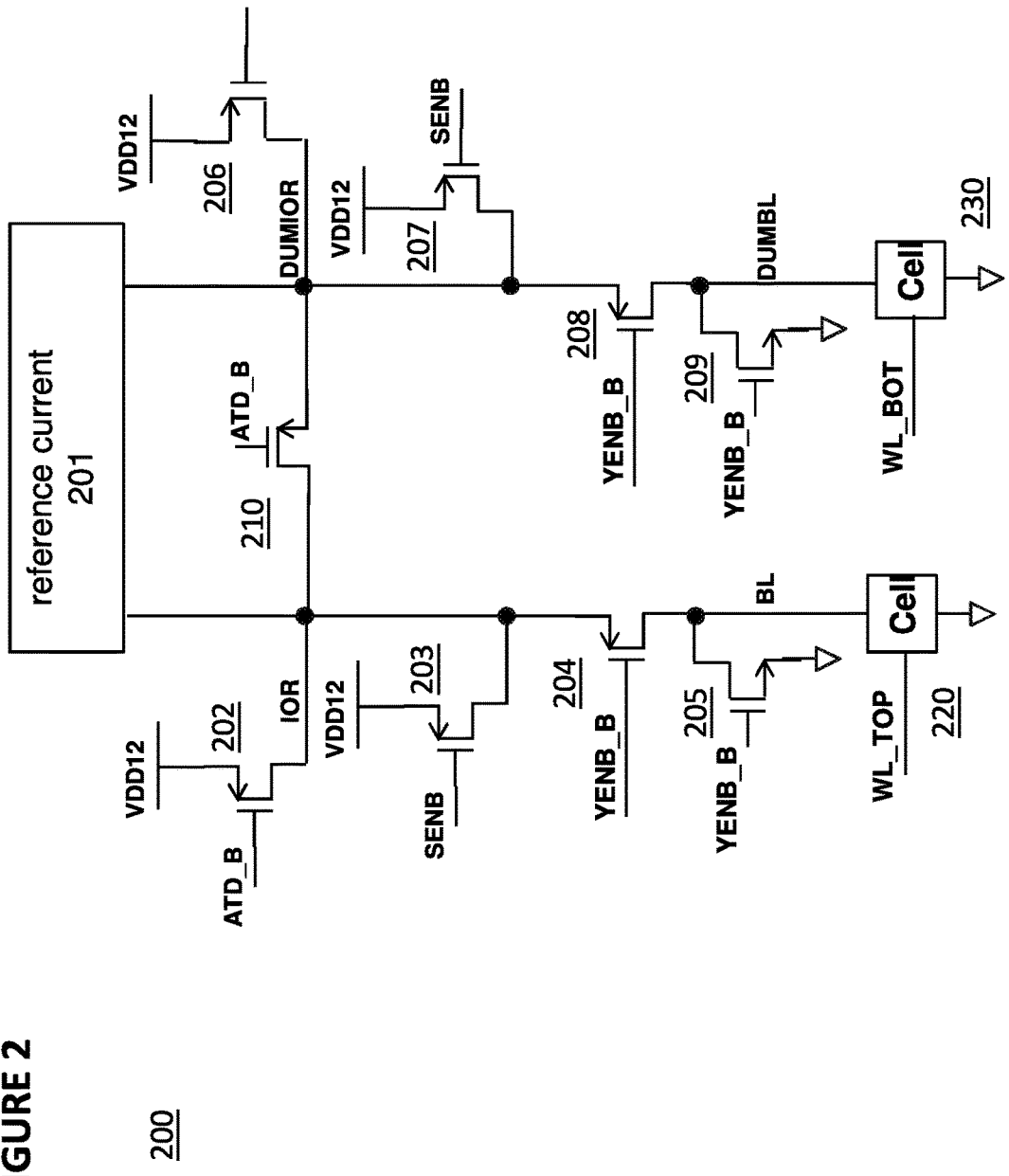
FIG. 2 depicts an embodiment of a pre-charge circuit.
Figure 3:
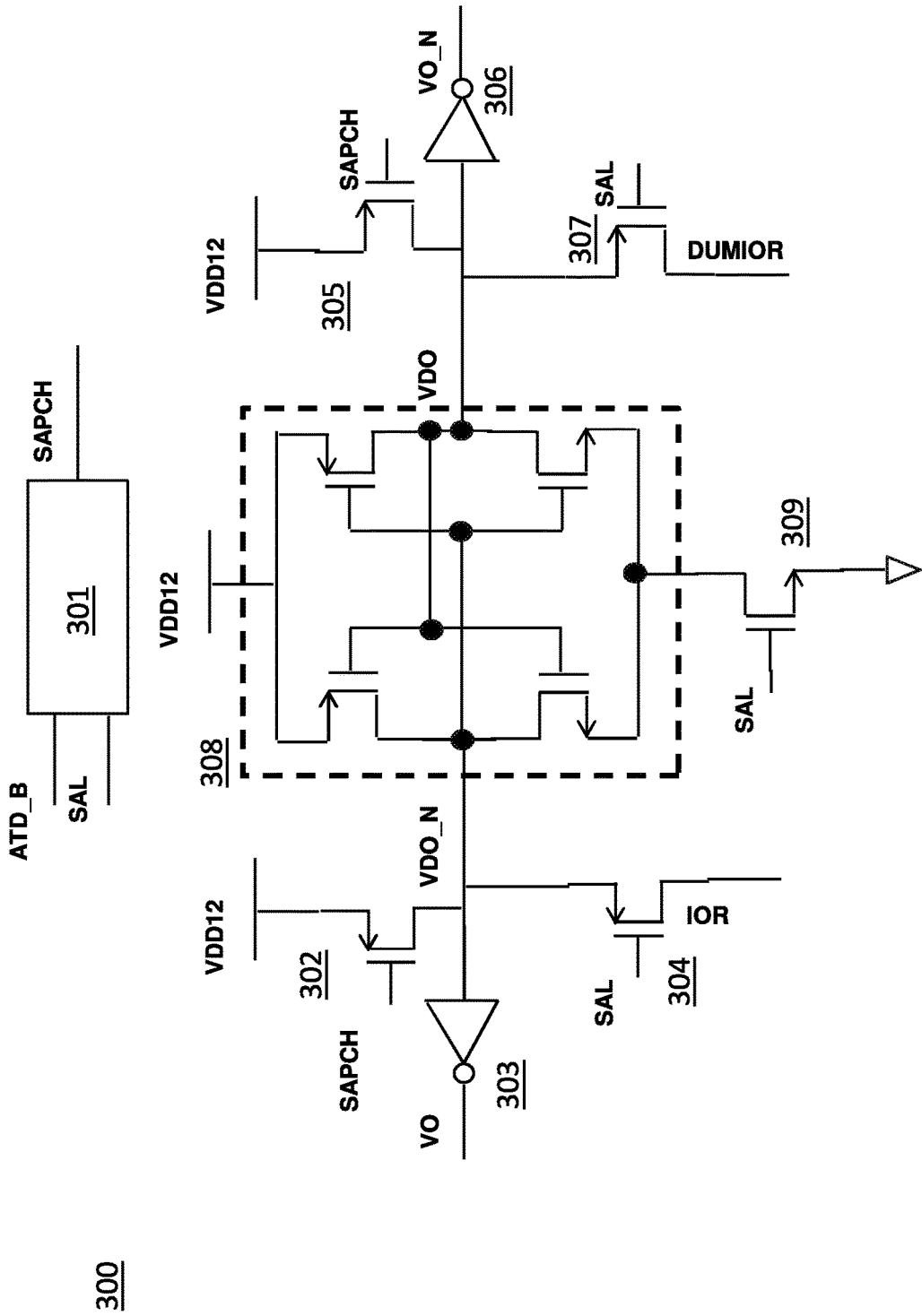
FIG. 3 depicts a sense amplifier for use with the pre-charge circuit of FIG. 2.

An embodiment is depicted in FIGS. 2 and 3. In FIG. 2, circuit 200 comprises a first sub-circuit coupled to selected memory cell 220 and a second sub-circuit coupled to dummy memory cell 230. Selected memory cell 220 and dummy memory cell 230 each can be of the type shown in FIG. 1. Other types are also known in the prior art.

The first sub-circuit comprises PMOS transistors 202, 203, and 204 and NMOS transistor 205, configured as shown. The second sub-circuit comprises PMOS transistors 206, 207, and 208 and NMOS transistor 209, configured as shown. The first sub-circuit and second sub-circuit are each coupled to reference current generator 201 and to PMOS transistor 210.

During a pre-charge period, ATD_B (address transition detection) is pulled low, turning on PMOS transistors 202, 206 and 210. SENB is pulled low, turning on PMOS transistors 203 and 207, which are coupled to VDD12. This results in nodes IOR and DUMIOR being placed at the same voltage, which will be approximately VDD12, which in this example is 1.2 volts. YENB_B (column enable) is pulled high, turning on NMOS transistors 205 and 209 and turning off PMOS transistors 204 and 208, which results in nodes BL (bit line) and DUMBL (dummy bit line) being pulled to ground.

During a read operation, ATD_B is pulled high, turning off PMOS transistors 202, 206, and 210. At the instant when the read operation begins, nodes IOR and DUMIOR are still at voltage VDD12. During a read operation, YENB_B is pulled low, turning on PMOS transistors 204 and 208 and turning off NMOS transistors 205 and 209. Bit line BL is coupled to selected cell 220, and dummy bit line DUMBL is coupled to dummy memory cell 230. Selected cell 220 also is coupled to word line WL_TOP, and dummy memory cell 230 is coupled to word line WL_BOT. The voltages on bit line BL and dummy bit line DUMBL will be affected by the current drawn by selected memory cell 220 and dummy memory cell 230. BL and DUMBL will keep the same potential as IO and DUMIOR, respectively, during a read mode.

With reference to FIG. 3, comparator and signal generation circuit 300 is shown. First circuit 301 receives inputs ATD_B (address transition detector, which will be asserted when a read address has been received) and SAL (sense address line) and generates output SAPCH (sense amplifier pre-charge signal), which is designed to ensure that the sensing data will not be changed until the next read cycle.

Nodes IOR and DUMIOR are connected to the same nodes with those labels in FIG. 2. IOR is coupled to PMOS transistors 302 and 304, inverter 303, and comparator 308 as shown. DUMIOR is coupled to PMOS transistors 305 and 307, inverter 306, and comparator 308 as shown. Comparator 308 is also coupled to NMOS transistor 309.

During a pre-charge period, SAPCH is pulled low, which causes nodes VDO and VDO_N to be pulled up to VDD12, and SAL is pulled high, pulling a node in comparator 308 down to ground.

During a read operation, SAL is pulled low and SAPCH is pulled high, resulting in PMOS transistors 304 and 307 being turned on and PMOS transistors 302 and 305 being turned off. IOR and DUMIOR will enter a "race" condition where each will draw current from nodes VDO_N and VDO, respectively. When one of the nodes VDO_N and VDO falls below a certain threshold, comparator 308 will cause the other node to be pulled to VDD12, which also result in the node being pulled to ground. For instance, if VDO_N falls below the threshold first, VDO will be pulled up to VDD12 through a PMOS transistor. VDO in turn will cause VDO_N to be pulled to ground through an NMOS transistor. The end result is that VDO_N and VDO will be at opposite values. One state will reflect a "1" being stored in selected memory cell 220, and the other state will reflect a "0" being stored in selected memory cell 220.

Figure 4:
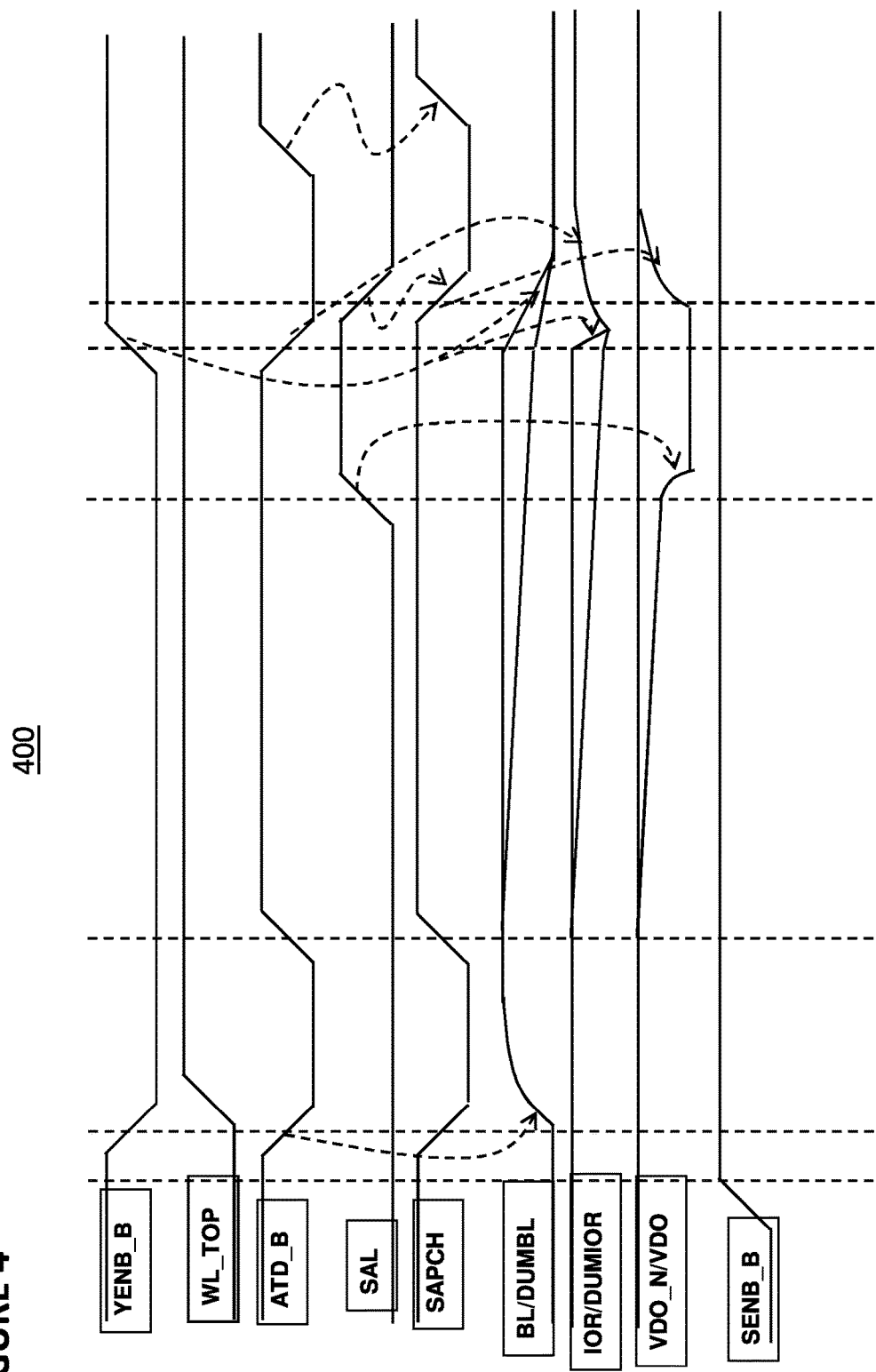
FIG. 4 depicts characteristics of the embodiments of FIGS. 2-3 during pre-charge and read operations.
Figure 5:
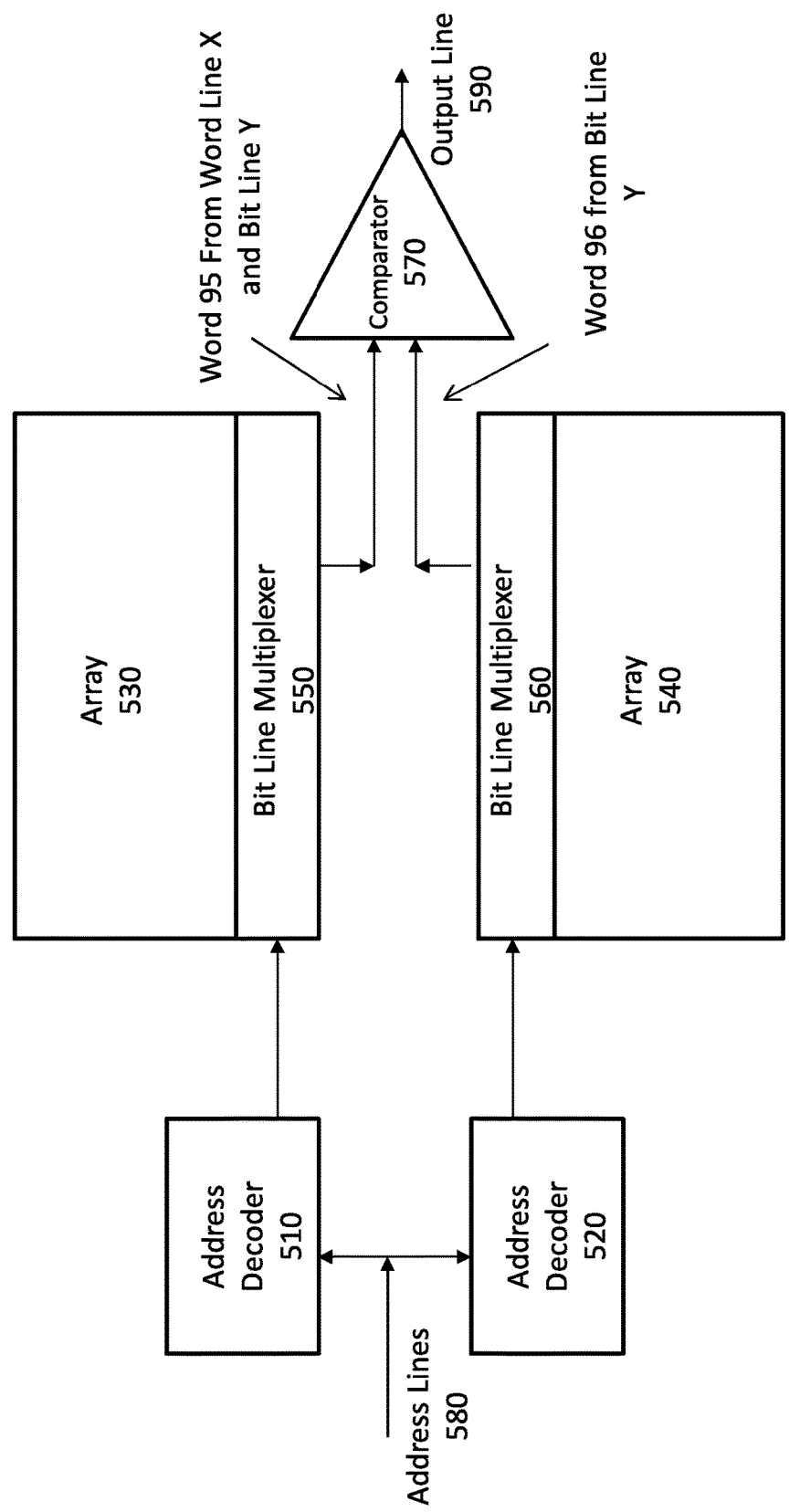
FIG. 5 depicts a prior art memory system.

FIG. 4 depicts timing diagram 400 for an exemplary sequence from a pre-charge period to a read mode, showing the signals depicted in FIG. 3, namely, YENB_B, WL_TOP, ATD_B, SAL, SAPCH, BL/DMBL, IOR/DUMIOR, VDO_N/VDO, and SENB_B.

Figure 6A:
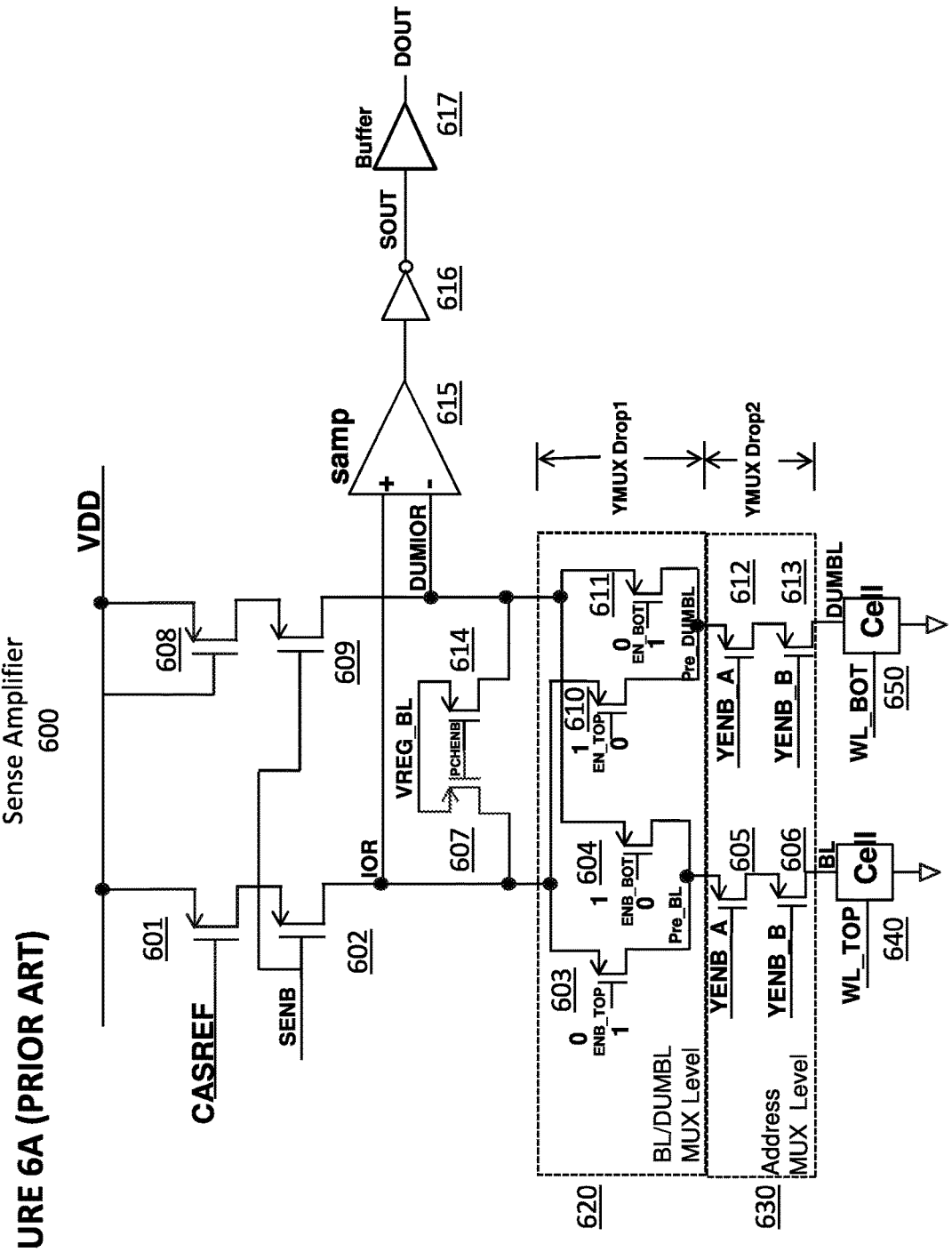
FIG. 6A depicts a prior art sense amplifier.
Figure 7A:
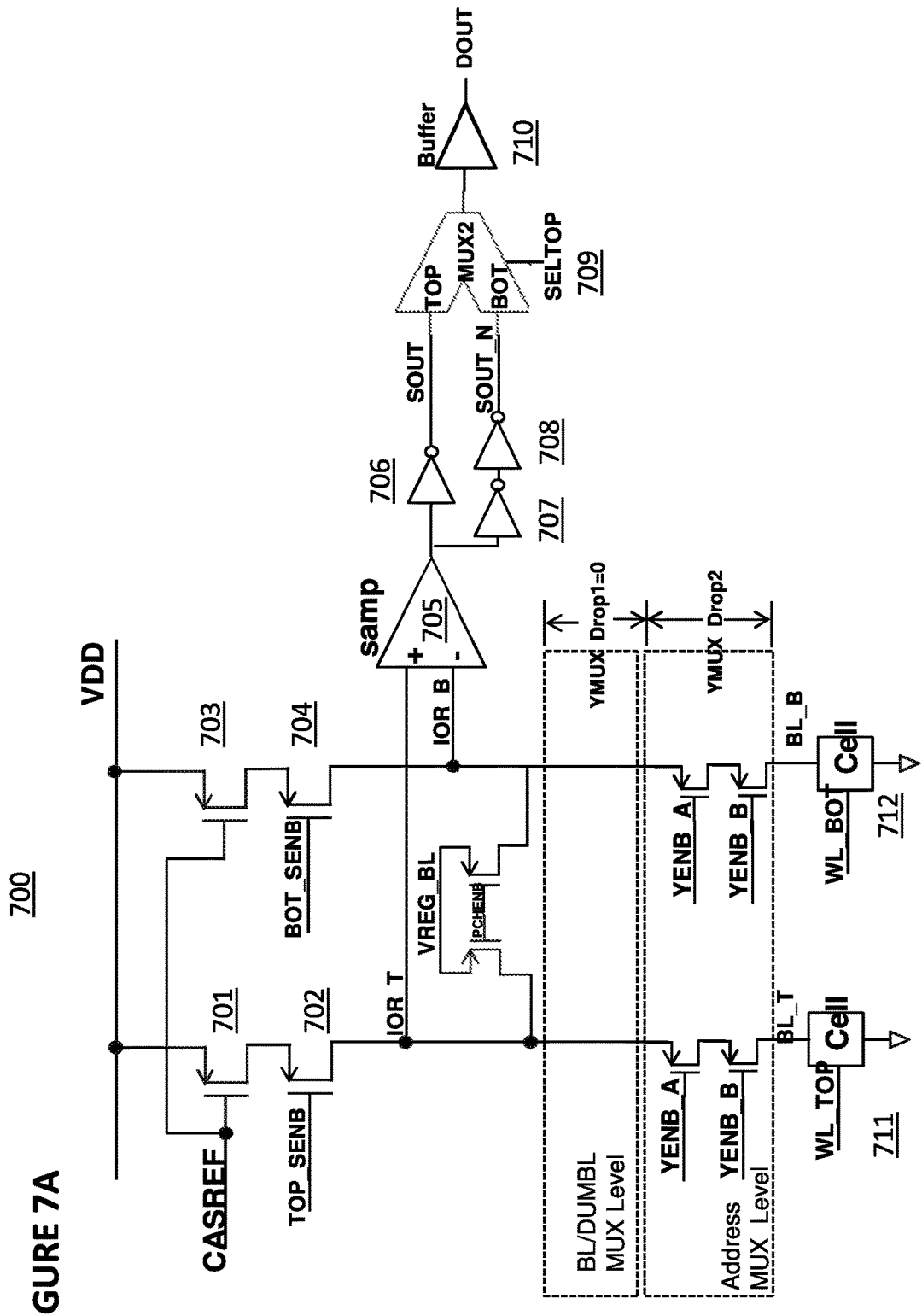
FIG. 7A depicts an embodiment of an improved sense amplifier.

FIG. 7A depicts an embodiment of an improved sense amplifier that reduces the delay time found in the prior art sense amplifier 600 of FIG. 6A.

Sense amplifier 700 contains similar components to sense amplifier 600, and the common components will not be described again for efficiency's sake. Sense amplifier comprises PMOS transistors 701, 702, 703, and 704. PMOS transistors 701 and 703 are completely symmetrical. The nodes IOR_T and IOR_B are input to comparator 705. The output of comparator is fed into inverter 706 as well as inverter 707. The output of inverter 706 is input into multiplexor 709. The output of inverter 707 is input into inverter 708. The output of inverter 708 is input into multiplexor 709. Multiplexor 709 is controlled by the signal SELTOP. The output of multiplexor 709 is fed into buffer 710, which outputs DOUT, which represents the value stored in selected top cell 711 or selected bottom cell 712.

Notably, in this embodiment, no bit line/dummy bit line multiplexor level is needed. By eliminating a level of multiplexing, the embodiment is able to reduce the amount of delay in the pre-charge operation. Also, there is no "dummy cell" in this embodiment. Both cells 711 and 712 can be used to store data. During a read operation of one of those cells, the other cell is disconnected, and the charge stored on the disconnected cell's bit line is used as a comparison point against the selected memory cell that is still connected.

Figure 7B:
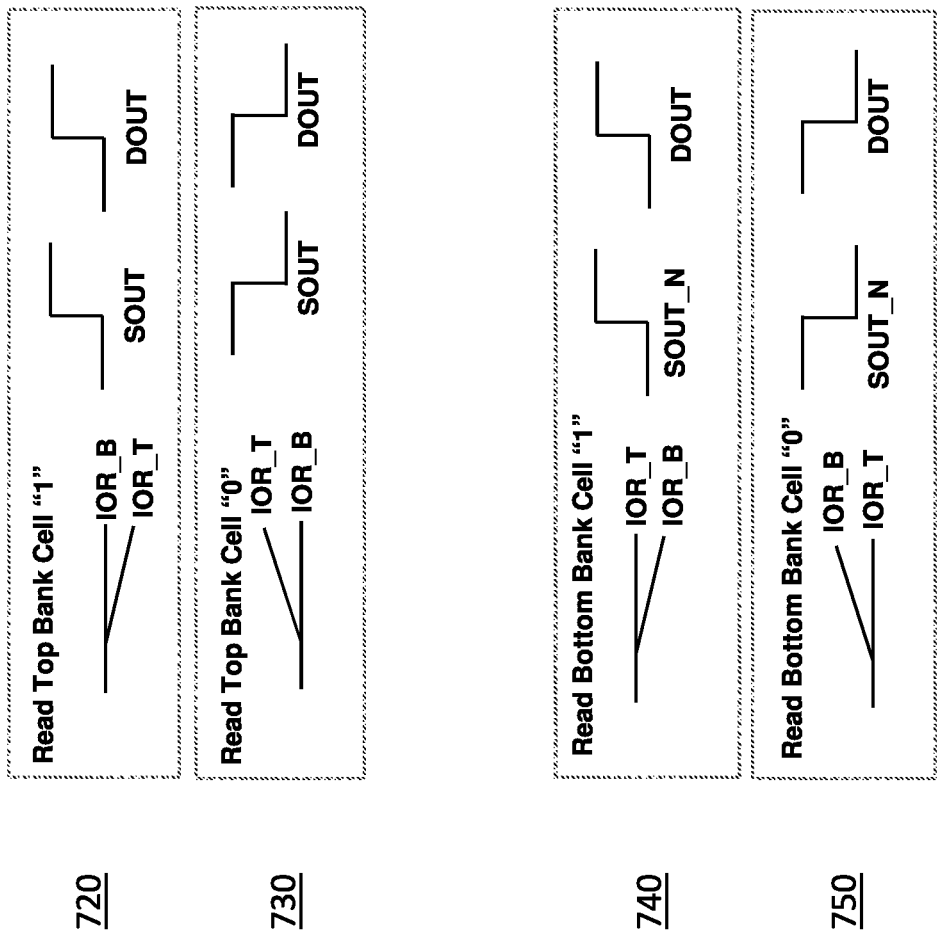
FIG. 7B depicts characteristics of the sense amplifier of FIG. 7A.

FIG. 7B illustrates some characteristics of sense amplifier 700. When it is desired to read the value in selected top cell 711, WL_TOP is asserted and WL_BOT is deasserted. TOP_SENB is low and BOT_SENDB is high. As a result, the node IOR_B initially is at the voltage level established by the pre-charge operation. If selected top cell 711 is storing a "1," IOR_T will be pulled down below the value of IOR_B. If selected top cell 711 is storing a "0," IOR_T will be pulled up above the value of IOR_B.

When it is desired to read the value in selected bottom cell 712, WL_TOP is asserted and WL_BOT is deasserted. TOP_SENB is high and BOT_SENDB is low. As a result, the node IOR_T initially is at the voltage level established by the pre-charge operation. If selected bottom cell 712 is storing a "1," IOR_B will be pulled down below the value of IOR_T. If selected top cell 712 is storing a "0," IOR_B will be pulled up above the value of IOR_T.

Figure 6B:
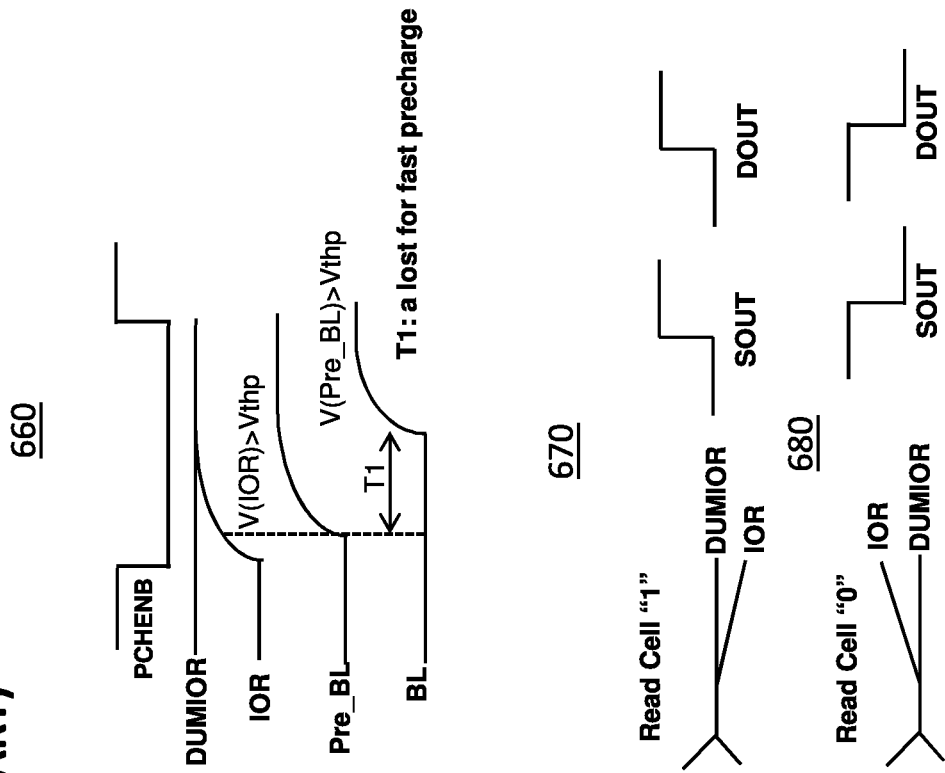
FIG. 6B depicts characteristics of the prior art sense amplifier of FIG. 6A during pre-charge operations.
Figure 7C:
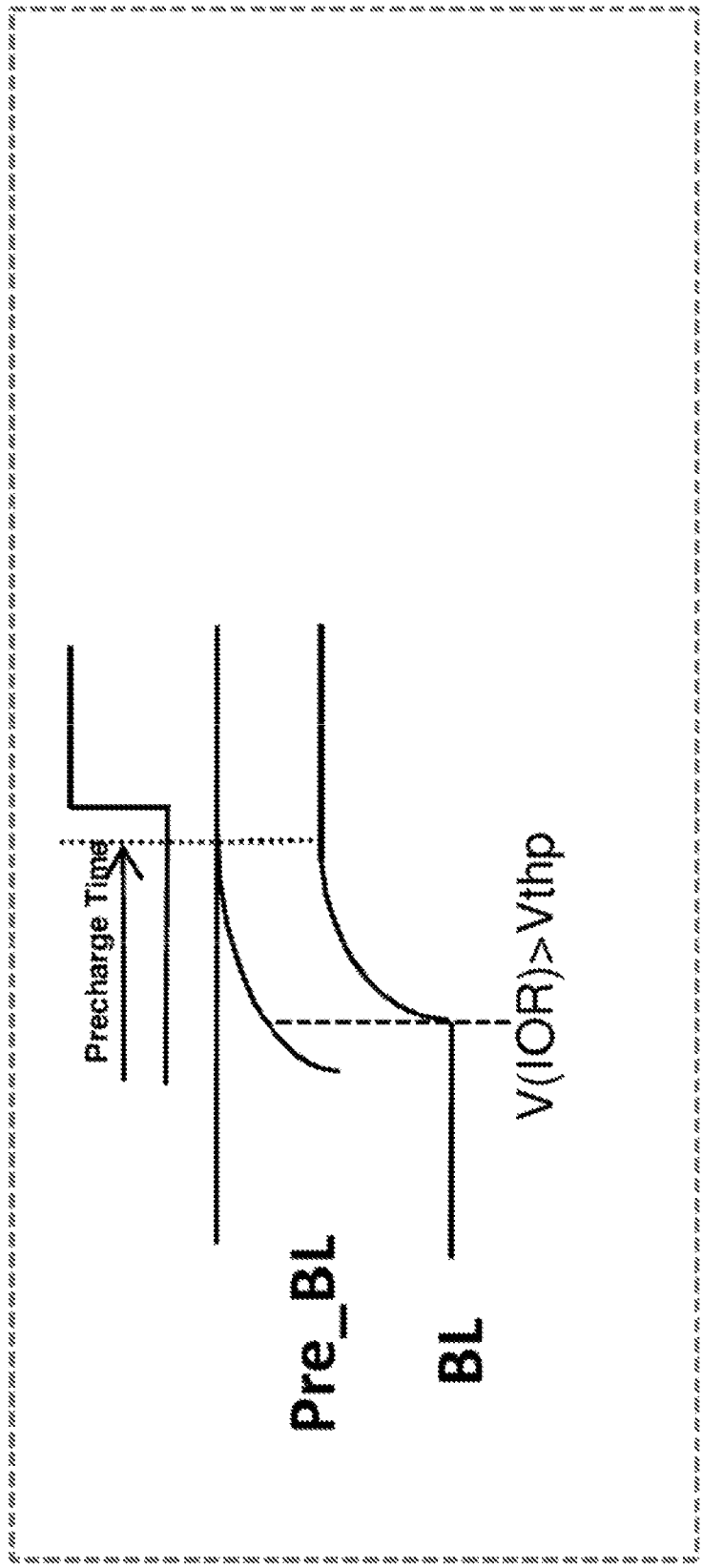
FIG. 7C depicts characteristics of the sense amplifier of FIG. 7A.

FIG. 7C depicts additional performance characteristics of sense amplifier 700. Timing diagram 760 shows the behavior of Pre-BL and BL during a pre-charge operation. As the reader will recall, in FIG. 6B, there was a delay of T1 before the pre-charge commenced on bit line BL. Here, there is no such delay, the pre-charging operation occurs faster by the time T1. This is a substantial improvement over the design of FIGS. 6A and 6B.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A sensing circuit for reading a selected flash memory cell in a first array of flash memory cells or in a second array of flash memory cells, comprising:
   a first circuit coupled to a first bit line in the first array;
   a second circuit coupled to a second bit line in the second array;
   a comparator comprising a first input coupled to a first node in the first circuit and a second input coupled to a second node the second circuit, an output of the comparator coupled to a first set of inverters and to a second set of inverters in parallel to the first set of inverters, the first set of inverters comprising an odd number of inverters and the second set of inverters comprising an even number of inverters;
   a multiplexer comprising a first input for receiving an output of the first set of inverters and a second input for receiving an output of the second set of inverters, the multiplexer controlled by a select signal to output a signal indicative of the data stored in the selected flash memory cell;
   wherein the select signal is set to a first state or a second state, the first state indicating that the first bit line is coupled to the selected flash memory cell and the second bit line is a reference bit line and the second state indicating that the first bit line is a reference bit line and the second bit line is coupled to the selected flash memory cell.

2. The sensing circuit of claim 1, further comprising:
a pre-charge circuit coupled to the first node and the second node to charge the first node and the second node to a predetermined voltage prior to a read operation.

3. The sensing circuit of claim 1, wherein the first circuit comprises a first PMOS transistor and the second circuit comprises a second PMOS transistor, wherein the first PMOS and second PMOS transistor are symmetrical.

4. The sensing circuit of claim 3, wherein the first PMOS and second PMOS transistor are activated during a read operation.

5. A sensing circuit for reading a selected flash memory cell in a first array of flash memory cells, comprising:
a first circuit coupled to a first bit line in the first array;
a second circuit coupled to a second bit line in a second array of flash memory cells; and
a comparator comprising a first input coupled to a first node in the first circuit and a second input coupled to a second node the second circuit, an output of the comparator indicating the value stored in the selected flash memory cell;
wherein the first circuit comprises circuitry for pulling the first bit line to ground and pre-charging the first node to a predetermined voltage during a pre-charge period, and the second circuit comprises circuitry for pulling the second bit line to ground and pre-charging the second node to the predetermined voltage during the pre-charge period.

6. The sensing circuit of claim 5, wherein the first circuit further comprises for pre-charging the first bit line and the first node to the predetermined voltage during a read active mode, and the second circuit comprises circuitry for pre-charging the second bit lint and the second node to the predetermined voltage during the read active mode.

* * * * *